United States Patent
Takehiro et al.

(10) Patent No.: US 6,391,797 B1
(45) Date of Patent: May 21, 2002

(54) METHOD OF MANUFACTURING SEMICONDUCTOR DEVICE BY SPUTTERING DIELECTRIC FORMING MATERIALS WHILE SELECTIVELY HEATING GROWING LAYER

(75) Inventors: Shinobu Takehiro; Satoshi Yamauchi; Masaki Yoshimaru, all of Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 08/923,246

(22) Filed: Sep. 4, 1997

(30) Foreign Application Priority Data

Sep. 4, 1996 (JP) .............................................. 8-253801

(51) Int. Cl.[7] .............................................. H01L 21/20
(52) U.S. Cl. ........................ 438/778; 438/763; 438/785
(58) Field of Search ................................ 438/788, 785, 438/778, 485, 779, 787, 761, 763, 396; 204/192.25, 298.09

(56) References Cited

U.S. PATENT DOCUMENTS

| 4,661,228 A | * | 4/1987 | Mintz ..................... 204/192.25 |
| 4,732,761 A | * | 3/1988 | Machida et al. ............ 437/228 |
| 4,891,118 A | * | 1/1990 | Ooiwa et al. ............... 204/298 |
| 4,931,169 A | * | 6/1990 | Scherer et al. |
| 5,078,847 A | * | 1/1992 | Grosman et al. |
| 5,500,102 A | * | 3/1996 | Ichikawa et al. ...... 204/192.25 |
| 5,510,011 A | * | 4/1996 | Okamura et al. ........ 204/192.3 |
| 5,572,052 A | * | 11/1996 | Kashihara et al. .......... 257/295 |
| 5,626,906 A | * | 5/1997 | Summerfelt et al. ..... 427/126.3 |
| 5,801,098 A | * | 9/1998 | Fiordalice et al. .......... 438/653 |

OTHER PUBLICATIONS

Mountsier et al., Excerpt of U.S Pat. No. 5,810,933 consisting of col. 1, filed Feb. 16, 1996.*

Shinobu Takehiro et al., "Low-Temperature Deposition of (Ba,Sr) TiO3 Thin Films for ULSI DRAM Applications by the Initial RF-Sputtering Step Control," Electrochemical Society Proceedings vol. 97–3 pp. 263–273. (No date).

S. Takehiro et al., "The simplest stacked BST capacitor for the future DRAMs using a novel low temperature growth enchanced crystallization", 1997 Symposium on VLSI Technology Digest of Technical Papers, pp. 153–154, 760–761.

* cited by examiner

Primary Examiner—Charles Bowers
Assistant Examiner—Evan Pert
(74) Attorney, Agent, or Firm—Volentine Francos, PLLC

(57) ABSTRACT

A method of manufacturing a semiconductor device, comprises the following steps of growing a dielectric film made of a dielectric material whose dielectric constant is improved by crystallization thereof, on a semiconductor substrate to utilize the dielectric film as a capacitor film, and applying a voltage to the semiconductor substrate in a plasma atmosphere to increase a grown interface temperature by "dielectric heating" upon growth of the dielectric film

12 Claims, 3 Drawing Sheets

METHOD OF MANUFACTURING SEMICONDUCTOR DEVICE BY SPUTTERING DIELECTRIC FORMING MATERIALS WHILE SELECTIVELY HEATING GROWING LAYER

BACKGROUND OF THE INVENTION

1. Field of the Invention

This invention relates to a method of manufacturing a semiconductor device, and particularly to a method of manufacturing a dielectric film suitable for use as a capacitor film of a capacitor installed on a semiconductor substrate.

2. Description of the Related Art

In a memory device such as a DRAM (Dynamic Random Access Memory), a memory capacitor composed of a capacitor and a select transistor for performing switching to the memory capacitor are formed on a semiconductor substrate as a cell unit.

The more the dielectric constant of the capacitor increases, the capacitor film of such a capacitor used for the memory device or communication LSI is more advantageous to a technique such as compactness in size or the like.

From this reason, attention is now focused on barium strontium titanate ($Ba_{1-x}Sr_xTiO_3$: where x satisfies the relations in $0 \leq x \leq 1$, and hereinafter called "BST"), which is extremely high in dielectric constant as compared with a dielectric film like a silicon oxide film or silicon nitride film.

This type of BST film can be formed by a general CVD process or sputtering process. It has been known that as the temperature of a growth interface of the BST film increases, a BST film having a high dielectric constant can be obtained, and the dielectric constant of the resultant BST film is greatly reduced at a growth interface temperature that falls below 400° C.

Therefore, the effective utilization of the BST film as the capacitor film needs to keep the growth interface of the BST film at a high temperature so as to grow a BST film having a high dielectric constant.

It is thus considered that the semiconductor substrate is heated by, for example, a heating coil source or the like over its entirety. However, various problems arise due to the diffusion of heat at components of the semiconductor device if the semiconductor substrate is heated over its entirety so as to obtain the high dielectric constant.

Particularly, for example, a communication LSI like a microwave monolithic IC using, as the semiconductor substrate, a compound semiconductor including a component such as GaAs easy to be free by heating will cause a great influence exerted on the semiconductor substrate by heating of the compound semiconductor.

Thus, since the semiconductor substrate cannot be sufficiently heated in the prior art even if the BST film whose dielectric constant is high, is incorporated therein as the capacitor film of the semiconductor device, the capacitor film indicative of the high dielectric constant could not be formed.

Therefore, a technique for forming a dielectric layer capable of providing a high dielectric constant without heating of the entire semiconductor substrate has been long-expected.

SUMMARY OF THE INVENTION

An object of this invention is to solve the above-described problems of the prior art and hence to adopt the following construction by noting that a dielectric material like a BST film has a growth interface temperature greatly affected by whether its crystal characteristic is good or bad, and a dielectric constant increased owing to an improvement in its crystal characteristic, a method of growing a dielectric film includes a sputtering process or plasma CVD process using a plasma atmosphere, and a method of heating the dielectric film includes a method of using particle energy in a plasma.

According to one aspect of this invention, there is thus provided a method of manufacturing a semiconductor device, comprising the following steps of:

growing a dielectric film composed of a dielectric material whose dielectric constant is improved by crystallization thereof, on a semiconductor substrate to utilize the dielectric film as a capacitor film; and applying a voltage to the semiconductor substrate in a plasma atmosphere to increase a growth interface temperature upon growth of the dielectric film.

The method of growing the dielectric film includes a growth method using a plasma atmosphere as in the case of, for example, a sputtering process or plasma CVD process. When a voltage is applied to a semiconductor substrate under such a plasma atmosphere, the surface of the semiconductor substrate subjected to the plasma atmosphere, which corresponds to the surface thereof on which a dielectric material is stacked, is principally heated by particle energy in a plasma.

From this point of view, the surface portion of the semiconductor substrate, which serves as the growth interface of the dielectric film, can be selectively maintained at a temperature most suitable for crystallization of the dielectric film without the semiconductor substrate being entirely heated to a high temperature most suitable for crystallization of the dielectric film.

Thus, since the growth interface of the dielectric film can be kept in a suitable high-temperature state without incurring bad effects due to entire heating of the semiconductor device including the semiconductor substrate, a good-quality dielectric film excellent in crystal characteristic and high in dielectric constant can be formed.

All the required thickness dimensions of the dielectric film can be formed while the voltage is being applied to the semiconductor substrate. Alternatively, the thin-film layer of the dielectric film is formed by applying the voltage thereto and thereafter the thin-film layer excellent in crystal characteristic is used as a base layer, whereby the dielectric film can be grown on the base layer in a state in which the semiconductor substrate has been heated over its entirety by a heating means similar to that employed in the art.

Since the thin-film layer constituting the base layer is excellent in crystal characteristic, a dielectric film quite excellent in crystal characteristic and demonstrative of a comparatively high dielectric constant as compared with the prior art can be grown even if the dielectric film is grown on the base layer by heating the semiconductor substrate over its entirety so that the temperature of the thin-film layer reaches a comparatively low temperature similar to that employed in the art.

The two-stage growth method for applying the voltage to the semiconductor substrate only upon growth of the base layer is advantageous particularly to a device structure disadvantageous to the application of the voltage to the semiconductor substrate for a long time.

Typical embodiments of the present invention have been shown in brief. However, the various embodiments of the present application and specific configurations of these embodiments will be understood from the following description.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

The present invention will hereinafter be described in detail by preferred embodiments illustrated in the accompanying drawings.

[Specific embodiment 1]

Figure 1:
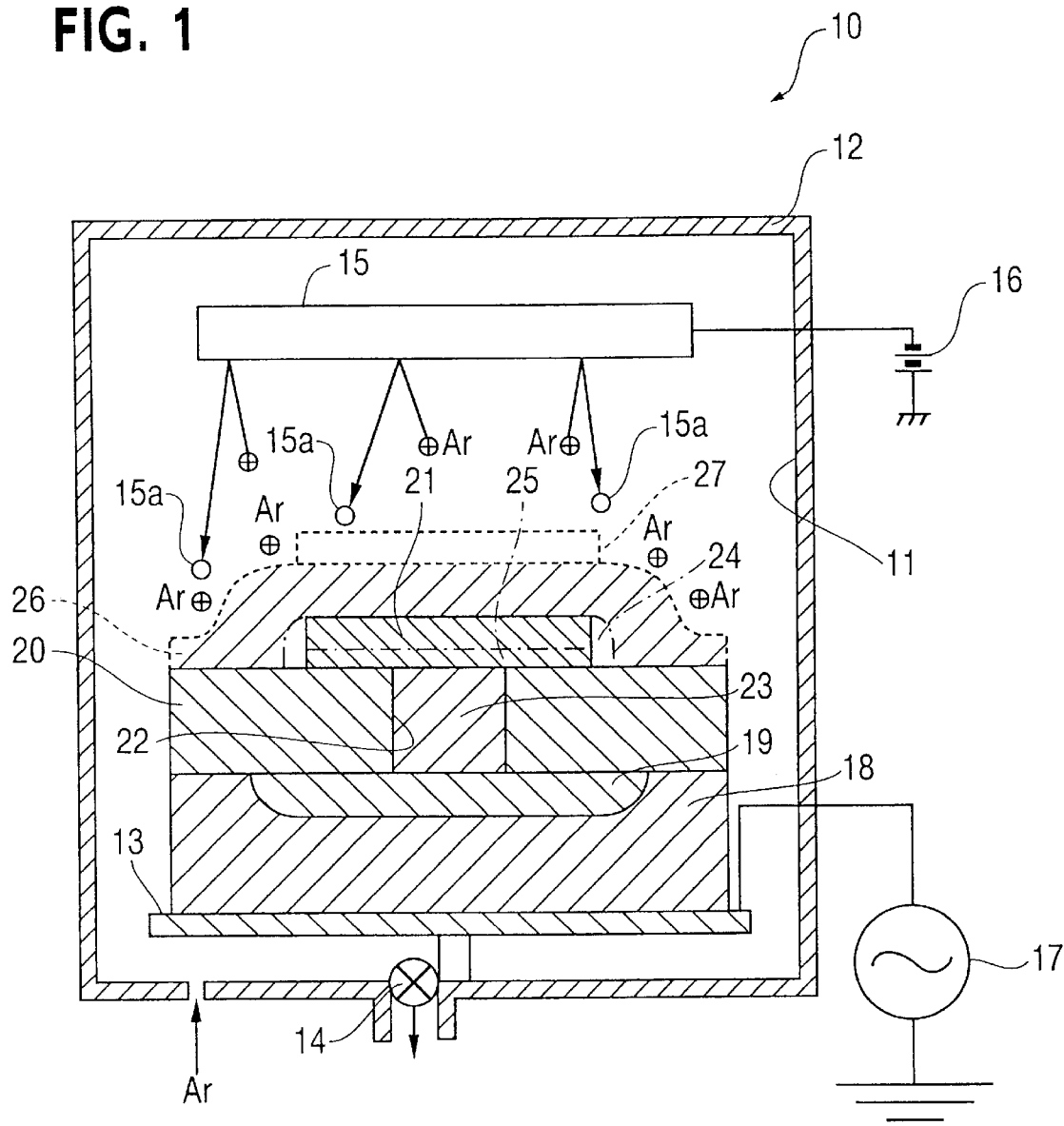
FIG. 1 is a schematic view of a sputter device for executing a manufacturing process in which a method of manufacturing a semiconductor device, according to the present invention is applied to a method of manufacturing a capacitor of a semiconductor memory.

FIG. 1 is a schematic view of a sputter device for executing a manufacturing process in which a method of manufacturing a semiconductor device, according to the present invention, is applied to a method of manufacturing a capacitor of a semiconductor memory.

As is well known in the art, the sputter device 10 has a housing 12 for defining a chamber 11 therein. A conductive sample table 13 is placed within the chamber 11. The chamber 11 is connected to a vacuum source (not shown) through a valve 14 provided within the housing 12 so that a vacuum is introduced into the chamber 11. Further, the chamber 11 is filled with an inert gas such as an argon gas (Ar) or the like, or oxygen. Moreover, a target 15 is placed within the chamber 11 with being spaced away from the sample table 13. A d.c. supply 16 provides a negative potential between the target 15 and the sample table 13 and is electrically connected to the target 15.

As is well known in the art, the basic operation and principle of the sputter device 10 is as follows: A glow discharge of Ar occurs in the chamber 11 under the action of the potential of the d.c. supply 16. Thus, the target 15 is subjected to sputtering by a collision of Argon ions (Ar') with the target 15, whereby target particles 15a subjected to this sputtering are deposited on the sample table 13. As a result, a film of a target material is grown on a sample.

In order to maintain a growth interface temperature of the film at a suitable growth temperature upon growth of the film of the target material, a high-frequency power source 17 is electrically connected to the sample table 13 of the sputter device 10. The action of the high-frequency power source 17 will be described in detail later in line with the description of the process of manufacturing the semiconductor device using the sputter device 10.

A description will be made of an example in which a memory capacitor of a DRAM semiconductor memory device is incorporated into a semiconductor substrate by using the sputter device 10.

A diffusion layer 19 serving as a conductive path is formed in a semiconductor substrate 18 composed of, for example, n-type silicon by, for example, ion implantation and heat treatment. An interlayer insulator 20 composed of silicon oxide is formed over the semiconductor substrate 18 so as to cover an upper surface of the diffusion layer 19.

A lower electrode 21 of the memory capacitor is installed or formed on the interlayer insulator 20. However, a through hole 22 is defined in the interlayer insulator 20 by the previously well-known photolithography and etching technique to obtain electrical connections between the lower electrode 21 and the diffusion layer 19 prior to the formation of the lower electrode 21. A silicon plug 23 composed of polysilicon doped with, for example, phosphorus is formed within the through hole 22.

After the formation of the plug 23, the lower electrode 21 electrically connected to the diffusion layer 19 serving as the conductive path through the plug 23 is formed. The lower electrode 21 can be made up of a metal material such as Ru, Ir, Pt or Ti. Side wall portions 24 each composed of an insulating material can be formed on both sides of the lower electrode 21 as needed. Further, a barrier layer 25 made of, for example, Ti or TiN can be provided between the lower electrode 21 and the silicon plug 23 to prevent the diffusion of heat by silicon from the silicon plug 23 to the lower electrode 21.

A dielectric film 26 is formed so as to cover the lower electrode 21 formed on the interlayer insulator 20 on the semiconductor substrate 18. In order to form a BST dielectric film on the semiconductor substrate 18 as the dielectric film 26, the semiconductor substrate 18 is placed on the sample table 13 so that the lower electrode 21 to form the dielectric film 26 thereon is opposed to the target 15 as shown in FIG. 1. At this time, BST serving as a dielectric material to be grown as the dielectric film 26 is used as the target 15.

As described above, the target particles 15a produced from the target 15 composed of the BST material are deposited on both the interlayer insulator 20 opposed to the target 15 and the lower electrode 21 on the interlayer insulator 20, whereby the dielectric film 26 composed of BST is grown.

Upon growth of the dielectric film 26, the high-frequency power source 17 is applied to the semiconductor substrate 18 through the sample table 13. Further, a plasma is generated within the chamber 11 by the glow discharge of Ar gas. Therefore, the plasma usually collides with a growth interface exposed or bare within the chamber 11, of the semiconductor substrate 18 subjected to high frequency dielectric heating so that the interaction between the plasma and the high frequency dielectric heating is produced.

Owing to the interaction between the plasma and the high frequency dielectric heating, an internal structural portion of the semiconductor substrate 18, which includes the diffusion layer 19 and the silicon plug 23, is maintained at a temperature that falls far below 400° C., whereas the growth interface is maintained at a suitable high temperature exceeding 400° C. most suitable for the growth of a good quality crystal of BST.

As a result, various bad effects developed by heating the entire semiconductor substrate 18 to high temperatures, such as reaction with the lower electrode 21 by the diffusion of silicon components of the silicon plug 23 with heat, an increase in electrical resistance due to the oxidation of the silicon plug 23, etc. can be avoided. Further, the growth interface of the dielectric film 26 composed of BST can be held at a temperature exceeding 400° C. suited to the growth of the crystal.

Thus, the dielectric film 26 having a dielectric constant much greater than that of a dielectric film like silicon oxide or silicon nitride can be formed without degradation in device characteristics.

After the completion of growth of the dielectric film 26, an upper electrode 27 paired with the lower electrode 21 is formed on the dielectric film 26 by the same material as that for the lower electrode 21, whereby a memory capacitor is formed. In relation to the memory capacitor, a previously well-known select transistor not shown in the drawing is formed on the semiconductor substrate 18. Thus, a memory cell is constructed of the select transistor and the memory capacitor.

Figure 2:
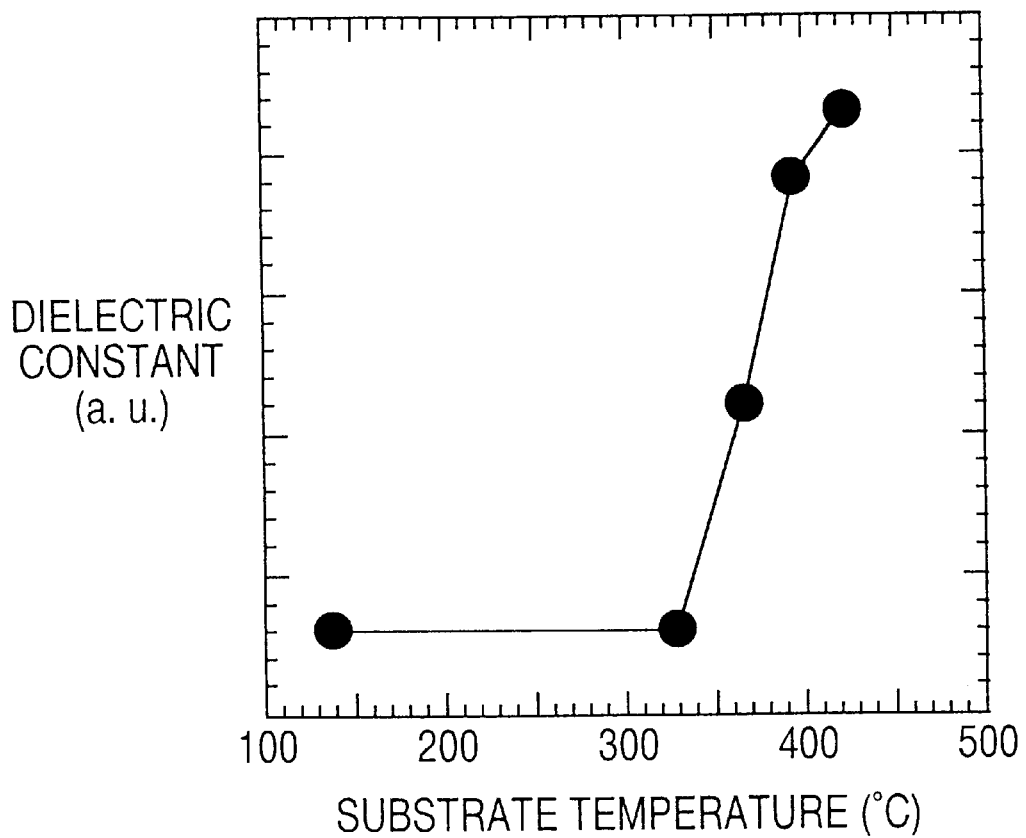
FIG. 2 is a graph for describing the relationship between a substrate temperature of a BST film obtained by a sputtering process and a dielectric constant thereof.

FIG. 2 is a graph showing the relationship between a substrate temperature and a dielectric constant of a BST film formed by a sputtering process. The horizontal axis of the graph indicates substrate temperature, i.e., a growth interface temperature (° C.) of the BST film and the vertical axis indicates a dielectric constant (a.u.) of the BST film.

As is apparent from this graph, the dielectric constant of the dielectric film 26 is greatly improved when the growth interface temperature of the dielectric film 26 composed of BST exceeds about 400° C. This is because when the growth interface temperature exceeds about 400° C. upon growth of BST, it is considered that its crystallization is greatly promoted and the dielectric constant is greatly improved with its crystallization.

On the other hand, the dielectric like the silicon oxide or silicon nitride does not exhibit the relationship like BST between a grown interface temperature of the dielectric and a change in dielectric constant thereof.

[Specific embodiment 2]

Although the high frequency dielectric heating has been used for the growth of all the thickness dimensions of the dielectric film 26 upon formation of the dielectric film 26 in FIG. 1, the dielectric film can be formed by using the high frequency dielectric heating and the conventional method free from the use of the high frequency dielectric heating in combination.

Figure 3:
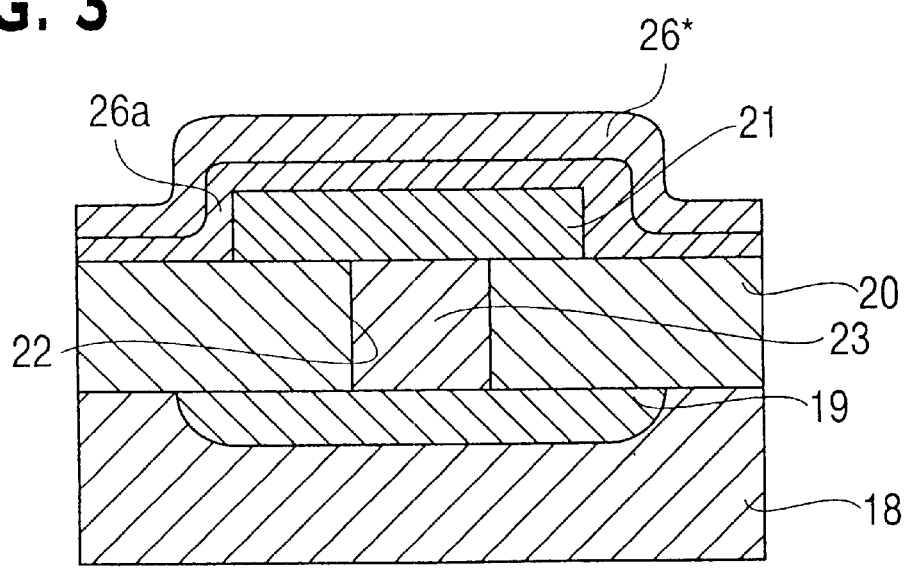
FIG. 3 is a manufacturing process drawing showing another specified embodiment of the method of manufacturing the semiconductor device according to the present invention.

FIG. 3 is a manufacturing process drawing showing another specific embodiment of the method of manufacturing the semiconductor device, according to the present invention. A dielectric film 26a made of a BST dielectric material is formed on a semiconductor substrate 18 having the same configuration as that shown in FIG. 1 by using high frequency dielectric heating and a plasma in the same manner as described above with reference to FIG. 1. A thickness dimension of the dielectric film 26a can be set so as to range from, for example, 5 nm to 10 nm sufficient to thinly cover the surfaces of an interlayer insulator 20 and a lower electrode 21.

The dielectric film 26a composed of this thin film exhibits an excellent crystal characteristic in the same manner as described above by reference to FIG. 1. Therefore, even if a growth interface temperature of a dielectric film 26* made of a BST dielectric material is set to a temperature below 400° C. upon using the dielectric film 26a as a base layer and subsequently growing the dielectric film 26* on the base layer, the dielectric film 26* having a dielectric constant sufficiently higher than ever can be grown on the base layer.

Figure 4:
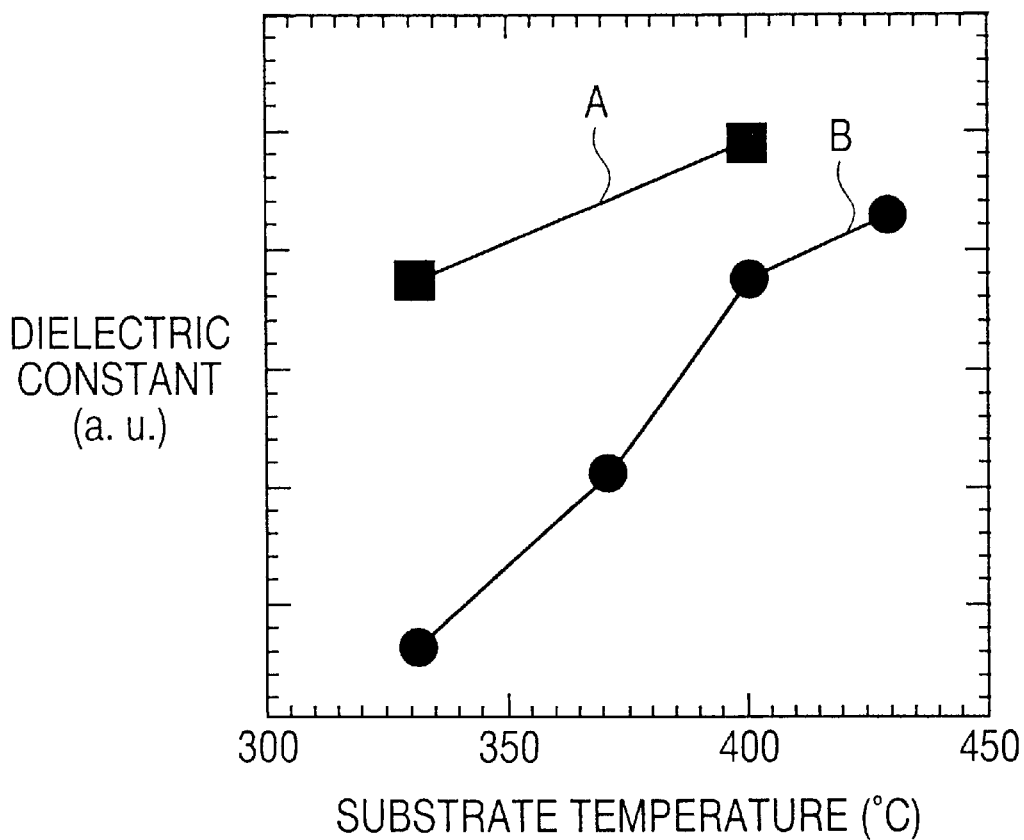
FIG. 4 is a graph illustrating a comparison between a dielectric film shown in FIG. 3 and a dielectric film formed by a conventional method.

FIG. 4 is a graph for describing a comparison between the BST dielectric film 26* grown on the base with the dielectric film 26a formed by applying high frequency dielectric heating to the semiconductor substrate as the base and a BST dielectric film formed in accordance with the conventional method without the use of the based layer, in the relationship between their substrate temperatures, i.e., growth interface temperature (horizontal axis) and their dielectric constants (vertical axis).

The line labeled A indicates a characteristic of the dielectric film 26* obtained by the method, according to the invention of the present application, of growing the BST film 26* on the base with the dielectric film 26a defined as the base. The line labeled B exhibits a characteristic of the dielectric film obtained by the conventional method using no base layer. As is apparent from the comparison between the two characteristic lines, the dielectric constant of the dielectric film 26* obtained by the method according to the invention of the present application becomes much greater than that obtained by the conventional method when both dielectric constants are compared under the same substrate temperature, i.e., the same grown interface temperature.

Therefore, the following method may be used in place of the application of the semiconductor substrate 18 to high frequency dielectric heating when the dielectric film 26* is grown on the base layer with the dielectric film 26a defined as the base layer. Namely, a dielectric film 26* having a sufficient high dielectric constant can be grown even if the semiconductor substrate 18 is heated over its entirety by, for example, a heating coil means or the like similar to one employed in the prior art so that the growth interface temperature of the dielectric film does not exceed 400° C. and the growth interface temperature is set to a comparatively low temperature.

Thus, according to a two-stage growth method for partially heating the semiconductor substrate 18 by the application of the high frequency dielectric heating thereto to maintain the temperature of the growth interface, thereby forming the dielectric film 26a serving as the base layer and subsequently heating the semiconductor substrate 18 over its entirety to maintain the temperature of the grown interface, a capacitor film having a dielectric constant higher than ever can be formed without subjecting the semiconductor substrate 18 to the high frequency dielectric heating for a long period.

Accordingly, the two-stage grown method is advantageous particularly to a device structure disadvantageous in high frequency dielectric heating over a long time.

Figure 5:
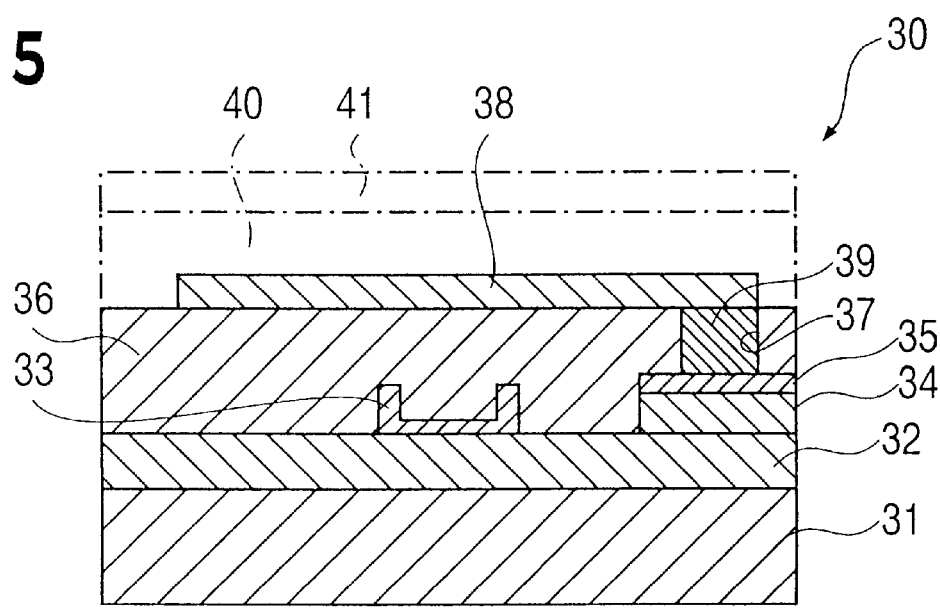
FIG. 5 is a manufacturing process drawing showing a further applied embodiment of the method of manufacturing the semiconductor device according to the present invention.

FIG. 5 is a manufacturing process drawing showing a further applied embodiment of the method of manufacturing the semiconductor device according to the present invention. FIG. 5 shows an embodiment in which the manufacturing method according to the present invention is applied to a microwave monolithic IC used as a communication LSI.

A semiconductor IC 30 has an n-type diffusion layer 32 constituting a first conductive path, which is formed over a GaAs semiconductor substrate 31. An electrode member 33 constituting a Schottky diode together with the diffusion layer 32 is formed of a metal material such as Au, Al, WSi so as to extend over the diffusion layer 32. Further, a like diffusion layer 34 constituting a second conductive path electrically connected to the diffusion layer 32 is formed on the diffusion layer 32. An electrode member 35 made of a material similar to that for the electrode member 33 is formed on the diffusion layer 34. An interlayer insulator 36 is formed over the diffusion layer 32 used as the first conductive path so as to cover the electrode member 33, diffusion layer 34 and electrode member 35.

A through hole 37 set free against the electrode member 35 is defined in the interlayer insulator 36. A lower electrode 38 for a capacitor, which is made of Au, Al, WSi, Ru or Ir, is formed over the interlayer insulator 36. The lower electrode 38 is electrically connected to the electrode member 35 through a silicon plug 39 formed within the through hole 37.

A dielectric film 40 composed of a BST dielectric material according to the present invention, is formed so as to cover the lower electrode 38 fabricated on the interlayer insulator 36 on the semiconductor substrate 31.

In a manner similar to the embodiment illustrated in FIG. 1, the dielectric film 40 can be formed by utilizing high frequency dielectric heating over its entire board thickness.

Since, however, the semiconductor substrate 31 is made of GaAs easy to liberate arsenic by heating and the material constituting the electrode member 33 is easy to diffuse into the diffusion layer 32 constituting the conductive path, the two-stage growth method described with reference to FIG. 3 may preferably be adopted to form the dielectric film 40.

After the formation of the dielectric film 40, an upper electrode 41 paired with the lower electrode 38 is formed over the dielectric film 40. The upper electrode 41 constitutes a capacitance in combination with the lower electrode 38 with the dielectric film 40 interposed therebetween.

The above description has been made of the example in which the a.c. voltage, i.e., the high frequency voltage is applied to the semiconductor substrate. As an alternative to this, a d.c. voltage can be applied to the semiconductor substrate. However, the high frequency dielectric heating may preferably be utilized by applying the high frequency voltage to the semiconductor substrate as shown in the drawing in order to obtain the dielectric film comparatively large in thickness dimension.

Although the d.c. supply has been illustrated as the power supply 16 for the sputter device 10, an a.c. power source can be applied as the power supply 16.

In the illustrated embodiment, the high frequency dielectric heating has been utilized in combination with the sputtering. However, the high frequency dielectric heating may be utilized in combination with a plasma CVD process for forming a BST film in a plasma atmosphere or other various dielectric forming methods using plasma as an alternative to the sputtering process.

While the BST dielectric material has been described as the dielectric material by way of example, a dielectric material such as tantalum oxide ($Ta_2O_5$) whose crystallization is promoted according to an increase in crystal growth temperature and whose dielectric constant is increased with its promotion, may be used in place of the BST dielectric material.

In a method of manufacturing a semiconductor device, according to the present invention, as described above, the application of a voltage to a semiconductor substrate in a plasma atmosphere allows a surface portion of the semiconductor substrate, which serves as a growth interface of a dielectric film, to be selectively maintained at a temperature most suitable for crystallization of the dielectric film through the use of particle energy of plasma without the semiconductor substrate being entirely heated to a high temperature most suitable for its crystallization.

Thus, according to the present invention, since the growth interface of the dielectric film can be kept in a suitable high-temperature state without incurring adverse effects by heating the semiconductor device including the semiconductor substrate over its entirety, a dielectric film large in dielectric constant and good in quality can be formed without degradation or the like in semiconductor device due to being heated to high temperatures, whereby a semiconductor device including a compact and high-performance capacitor can be formed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A method of forming a dielectric film on a semiconductor substrate comprising:

providing a target made of a material of the dielectric film;

positioning the semiconductor substrate to be facing the target, the semiconductor substrate including an internal portion and a surface portion facing the target;

introducing an inert gas between the target and the semiconductor substrate;

generating positive ions from the inert gas;

applying a negative electrical potential to the dielectric target so that the positive ions collide with the target; and applying an alternating electric signal independent of the applied negative potential to the semiconductor substrate, the applied alternating electric signal causing the surface portion of the semiconductor substrate to heat to a surface temperature at which the dielectric film is grown while the internal portion of the semiconductor substrate remains at a temperature lower than the surface temperature.

2. A method of forming a dielectric film on a semiconductor substrate according to claim 1, wherein the surface temperature is about 400 degrees centigrade.

3. A method of forming a dielectric film on a semiconductor substrate according to claim 1, wherein of generating positive ions includes subjecting a glow discharge to the inert gas.

4. A method of forming a dielectric film on a semiconductor substrate according to claim 1, wherein the negative electric potential is provided from a direct current supply source.

5. A method of forming a dielectric film on a semiconductor substrate according to claim 1, wherein the alternating electric signal is generated by an alternating current source.

6. A method of forming a dielectric film on a semiconductor substrate according to claim 1, wherein the inert gas is an argon gas.

7. A method of forming a dielectric film on a semiconductor substrate, the semiconductor substrate including an internal portion and a surface portion facing a target, the method comprising:

forming a first thin dielectric film on the semiconductor substrate by a first sputtering process, said first sputtering process including applying a negative electrical potential to the target such that positive ions collide with the target and applying an alternating electric signal independent of the applied negative potential to the semiconductor substrate, the applied alternating electric signal causing the surface portion of the semiconductor substrate to heat to a surface temperature at which the dielectric film is grown while the internal portion of the semiconductor substrate remains at a temperature lower then the surface temperature; and forming a second thin dielectric film on the first thin dielectric film by a second sputtering process.

8. A method of forming a dielectric film on a semiconductor substrate according to claim 7, wherein the surface temperature is about 400 degrees centigrade.

9. A method of forming a dielectric film on a semiconductor according to claim 7, wherein the negative electric potential is provided from a direct current supply source.

10. A method of forming dielectric film on a semiconductor substrate according to claim 7, wherein the alternating electric signal is generated by an alternating current source.

11. A method of forming a dielectric film on a semiconductor according to claim 9, wherein the positive ions are argon ions.

12. A method of forming a dielectric film on a semiconductor according to claim 7, wherein the second sputtering process includes cessation of the alternating electric signal before initiating sputtering.

* * * * *